United States Patent
Park et al.

(10) Patent No.: US 12,058,911 B2
(45) Date of Patent: Aug. 6, 2024

(54) COLOR FILTER AND DISPLAY DEVICE COMPRISING SAME

(71) Applicant: SAMSUNG DISPLAY CO., LTD., Yongin-si (KR)

(72) Inventors: Youngeun Park, Yongin-si (KR); Gunshik Kim, Yongin-si (KR); Junghwan Yi, Yongin-si (KR); Mira Gwon, Yongin-si (KR); Seungin Baek, Yongin-si (KR); Sangyun Lim, Yongin-si (KR); Sujin Choi, Yongin-si (KR); Younho Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 735 days.

(21) Appl. No.: 17/286,895

(22) PCT Filed: Jun. 13, 2019

(86) PCT No.: PCT/KR2019/007138
§ 371 (c)(1),
(2) Date: Apr. 20, 2021

(87) PCT Pub. No.: WO2020/085606
PCT Pub. Date: Apr. 30, 2020

(65) Prior Publication Data
US 2021/0351238 A1  Nov. 11, 2021

(30) Foreign Application Priority Data

Oct. 26, 2018 (KR) ........................ 10-2018-0129369

(51) Int. Cl.
*H10K 59/38* (2023.01)
*G02B 5/20* (2006.01)
(Continued)

(52) U.S. Cl.
CPC ............. *H10K 59/38* (2023.02); *G02B 5/206* (2013.01); *H10K 50/856* (2023.02); *H10K 50/865* (2023.02); *H10K 59/12* (2023.02)

(58) Field of Classification Search
CPC ..... H10K 59/38; H10K 50/865; H10K 50/856
(Continued)

(56) References Cited

U.S. PATENT DOCUMENTS 10,185,066 B2  1/2019  Chae et al.
10,197,844 B2  2/2019  Lee et al.
(Continued)

FOREIGN PATENT DOCUMENTS

EP         3339920 A1    6/2018
KR    1020100066416 A    6/2010
(Continued)

OTHER PUBLICATIONS

International Search Report mailed Sep. 23, 2019 for PCT/KR2019/007138, citing the above reference(s).

*Primary Examiner* — Christopher M Raabe
(74) *Attorney, Agent, or Firm* — CANTOR COLBURN LLP

(57) ABSTRACT

Provided is a color filter having improved light efficiency and color reproducibility. The color filter includes: a substrate having a plurality of pixel areas and a light blocking area surrounding the plurality of pixel areas; a light blocking layer on the light blocking area; a first color conversion layer on a first pixel area among the plurality of pixel areas and configured to convert incident light into light of a first color; a first color filter layer between the substrate and the first color conversion layer and configured to selectively transmit the light of the first color emitted from the first color conversion layer; and a light reflection layer between the
(Continued)

first color conversion layer and the first color filter layer and including a reflective material.

20 Claims, 15 Drawing Sheets

(51) Int. Cl.
*H10K 50/856* (2023.01)
*H10K 50/86* (2023.01)
*H10K 59/12* (2023.01)

(58) Field of Classification Search
USPC ............................................... 313/506
See application file for complete search history.

(56) References Cited

U.S. PATENT DOCUMENTS

| | | | |
|---|---|---|---|
| 10,228,586 | B2 | 3/2019 | Chae et al. |
| 10,371,984 | B2 | 8/2019 | Song et al. |
| 2010/0013741 | A1 | 1/2010 | Watanabe |
| 2017/0005293 | A1 | 1/2017 | Kim et al. |
| 2017/0059940 | A1 | 3/2017 | Kim et al. |
| 2018/0088261 | A1* | 3/2018 | Song .................. G02B 5/206 |
| 2018/0113356 | A1 | 4/2018 | Lee et al. |
| 2018/0120646 | A1 | 5/2018 | Lee et al. |
| 2018/0156951 | A1* | 6/2018 | Baek ............. G02F 1/133512 |
| 2018/0157086 | A1 | 6/2018 | Cho et al. |
| 2020/0212109 | A1* | 7/2020 | Lee ............... G02F 1/133514 |
| 2020/0321400 | A1* | 10/2020 | Park .................... H10K 59/12 |
| 2021/0311232 | A1* | 10/2021 | Jung ............. G02F 1/133617 |
| 2021/0328168 | A1* | 10/2021 | Park .................. H10K 50/854 |
| 2021/0336224 | A1* | 10/2021 | Yun ..................... H10K 71/00 |
| 2022/0209157 | A1* | 6/2022 | Lee .................... H10K 50/131 |

FOREIGN PATENT DOCUMENTS

| | | |
|---|---|---|
| KR | 1020170003297 A | 1/2017 |
| KR | 101720896 B1 | 3/2017 |
| KR | 1020180018945 A | 2/2018 |
| KR | 1020180035286 A | 4/2018 |
| KR | 1020180035287 A | 4/2018 |
| KR | 1020180044474 A | 5/2018 |
| KR | 1020180049462 A | 5/2018 |

* cited by examiner

COLOR FILTER AND DISPLAY DEVICE COMPRISING SAME

This application is a National Phase of International Application No. PCT/KR2019/007138 filed on Jun. 13, 2019, which is claims priority of Korean Patent Application No. 10-2018-0129369 filed on Oct. 26, 2018, which is hereby incorporated herein by reference in its entirety for all purposes.

TECHNICAL FIELD

The disclosure relates to a color filter and a display device including the same, and more particularly, to a color filter having improved light efficiency and color reproducibility, and a display device including the same.

BACKGROUND ART

Among display devices, an organic light-emitting display device has wide viewing angles, high contrast, and fast response times. Thus, the organic light-emitting display device has attracted the attention as a next-generation display device.

An organic light-emitting display device includes thin-film transistors and organic light-emitting elements above a substrate, and the organic light-emitting elements emit light by themselves. Organic light-emitting display devices may be used as displays for small products such as mobile phones or large products such as televisions.

Recently, as the resolution of organic light-emitting display devices has been increasing, studies have been actively conducted to improve color reproducibility of pixels.

DESCRIPTION OF EMBODIMENTS

Technical Problem

The disclosure provides a color filter having improved light efficiency and color reproducibility, and a display device including the same. However, this is merely an example, and the scope of the disclosure is not limited thereby.

Solution to Problem

According to an embodiment of the disclosure, a color filter includes: a substrate on which a plurality of pixel areas and a light blocking area surrounding the plurality of pixel areas are defined; a light blocking layer on the light blocking area; a first color conversion layer on a first pixel area among the plurality of pixel areas, where the first color conversion layer converts incident light into light of a first color; a first color filter layer between the substrate and the first color conversion layer, where the first color filter layer selectively transmits the light of the first color emitted from the first color conversion layer; and a light reflection layer between the first color conversion layer and the first color filter layer, where the light reflection layer includes a reflective material.

According to an embodiment, the first color filter layer may cover an edge of the light blocking layer, and the light reflection layer may overlap the light blocking layer.

According to an embodiment, the color filter may further include: a second color conversion layer on a second pixel area apart from the first pixel area by the light blocking area among the plurality of pixel areas, where the second color conversion layer may convert the incident light into light of a second color; and a second color filter layer between the substrate and the second color conversion layer, where the second color filter layer may selectively transmit the light of the second color emitted from the second color conversion layer.

According to an embodiment, the color filter may further include a partition wall between the first color conversion layer and the second color conversion layer on the light blocking area, where the partition wall may include a reflective material.

According to an embodiment, the color filter may further include: a transmission layer on a third pixel area apart from the first pixel area and the second pixel area by the light blocking area among the plurality of pixel areas, where the transmission layer may transmit the incident light; and a third color filter layer between the substrate and the transmission layer, where the third color filter layer may selectively transmit the incident light.

According to an embodiment, the incident light may be blue light, and the first color may be red or green.

According to an embodiment, the color filter may further include: a third color conversion layer on a third pixel area apart from the first pixel area and the second pixel area by the light blocking area among the plurality of pixel areas, where the third color conversion layer may convert the incident light into light of a third color; and a third color filter layer between the substrate and the third color conversion layer, where the third color filter layer may selectively transmit the light of the third color emitted from the third color conversion layer.

According to an embodiment, the incident light may be ultraviolet light, and the first color may be red, green, or blue.

According to an embodiment, the light reflection layer may be between the second color conversion layer and the second color filter layer to overlap the light blocking layer.

According to an embodiment, the first color conversion layer may include first quantum dots which are excited by the incident light and emit the light of the first color having a wavelength longer than a wavelength of the incident light.

According to an embodiment, the incident light may have a wavelength shorter than a wavelength of the light of the first color.

According to an embodiment, the light blocking layer may include a light absorbing material including an organic material.

According to an embodiment, the color filter may further include a first partition wall arranged to cover sidewalls of the first color conversion layer and the first color filter layer corresponding to the light blocking area and including a reflective material.

According to an embodiment, the color filter may further include: a second color conversion layer on a second pixel area among the plurality of pixel areas, where the second color conversion layer may convert the incident light into light of a second color; a second color filter layer between the substrate and the second color conversion layer, where the second color filter layer may selectively transmit the light of the second color emitted from the second color conversion layer; and a second partition wall arranged to cover sidewalls of the second color conversion layer and the second color filter layer corresponding to the light blocking area, where the second color filter layer may include a reflective material.

According to an embodiment, the color filter may further include a filling layer between the first partition wall and the second partition wall corresponding to the light blocking area.

According to another embodiment of an disclosure, a display device includes: a display panel in which a plurality of pixels are arranged, where each of the plurality of pixels includes a light-emitting element; and a color filter which converts a wavelength of light emitted from the light-emitting element of each of the plurality of pixels to implement a color, where the color filter includes: a first substrate on which a plurality of pixel areas and a light blocking area surrounding the plurality of pixel areas are defined; a light blocking layer on the light blocking area; a first color conversion layer on a first pixel area among the plurality of pixel areas and configured to convert incident light into light of a first color; a first color filter layer between the first substrate and the first color conversion layer, where the first color filter layer selectively transmits the light of the first color emitted from the first color conversion layer; and a light reflection layer between the first color conversion layer and the first color filter layer, where the light reflection layer includes a reflective material.

According to an embodiment, the display panel may include: a second substrate on which the plurality of pixels are arranged; and a thin-film encapsulation layer on the second substrate.

According to an embodiment, the display device may further include a filling layer between the thin-film encapsulation layer and the color filter.

According to an embodiment, the first color filter layer may be arranged in the color filter to cover an edge of the light blocking layer, and the light reflection layer is arranged in the color filter to overlap the light blocking layer.

According to an embodiment, the color filter may further include: a second color conversion layer on a second pixel area apart from the first pixel area by the light blocking area among the plurality of pixel areas, where the second color conversion layer may convert the incident light into light of a second color; a second color filter layer between the first substrate and the second color conversion layer, where the second color filter layer may selectively transmit the light of the second color emitted from the second color conversion layer; and a partition wall between the first color conversion layer and the second color conversion layer on the light blocking area, where the partition wall may include a reflective material.

Other features of the disclosure will become better understood through the accompanying drawings, the claims and the detailed description.

Advantageous Effects of Disclosure

According to an embodiment of the disclosure, as described herein, a color filter having improved light efficiency and color reproducibility and a display device including the same may be implemented. The scope of the disclosure is not limited by such an effect.

MODE OF DISCLOSURE

Figure 1:
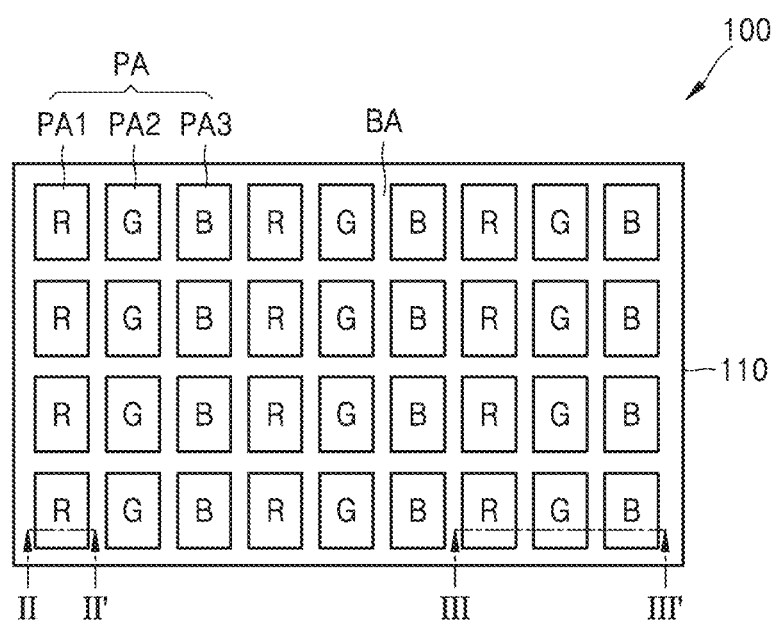
FIG. 1 is a schematic plan view of a color filter according to an embodiment of the disclosure.

As the description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another. The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements. It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
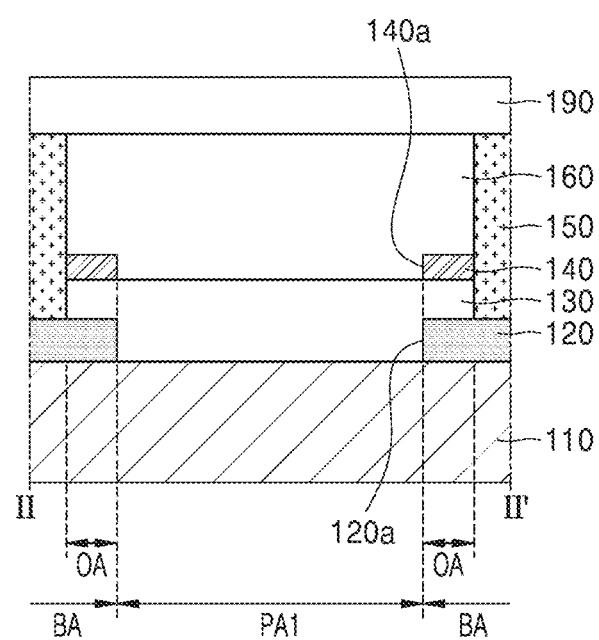
FIGS. 2 and 3 are schematic cross-sectional views of a color filter according to an embodiment of the disclosure.
Figure 3:
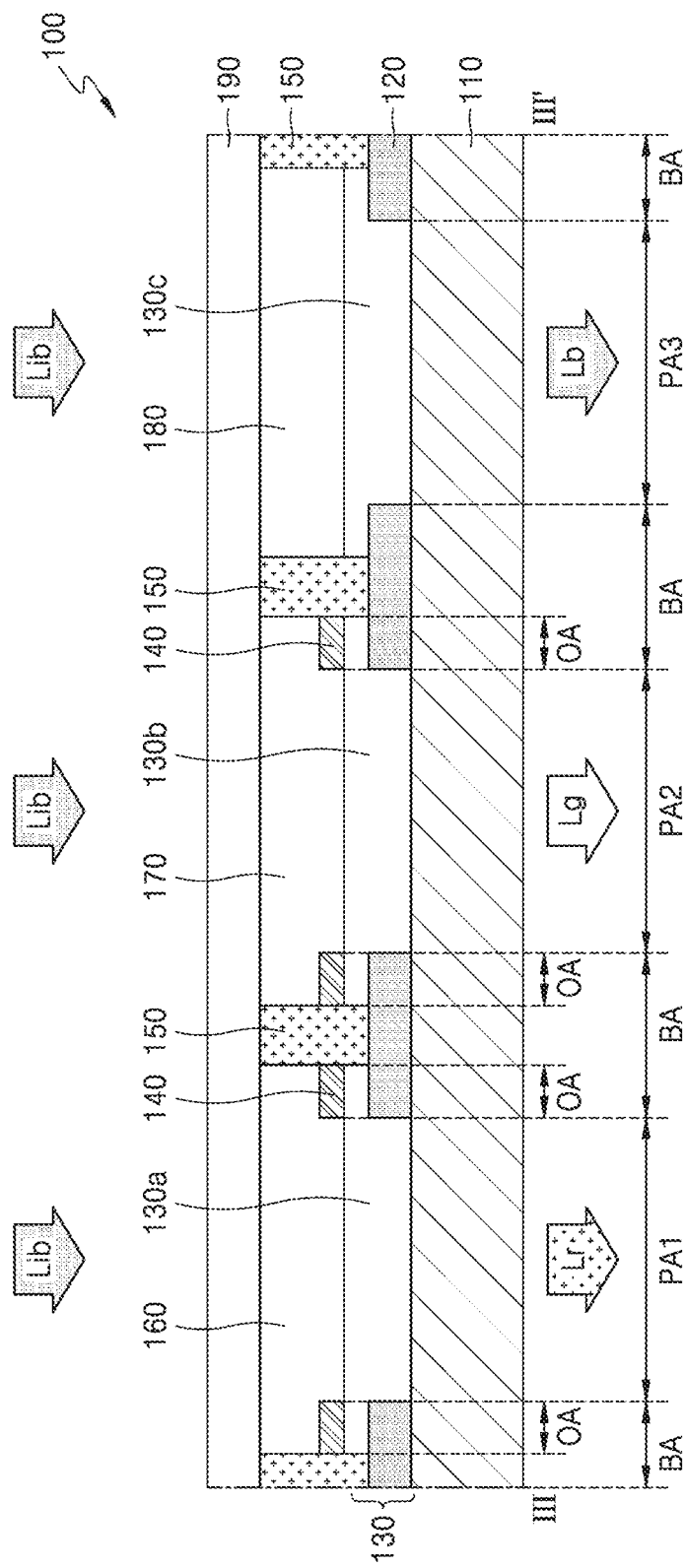

FIG. 1 is a schematic plan view of a color filter according to an embodiment of the disclosure. FIGS. 2 and 3 are schematic cross-sectional views of the color filter taken along lines II-II' and III-III' of FIG. 1, according to an embodiment of the disclosure.

Referring to FIGS. 1 and 2, an embodiment of a color filter 100 includes a substrate 110, a light blocking layer 120, a color filter layer 130, a light reflection layer 140, a partition wall 150, and a first color conversion layer 160.

The substrate 110 may include a first pixel area PA1 and a light blocking area BA surrounding the first pixel area PA1. The first color conversion layer 160 may be on the first pixel area PA1 and may convert incident light into light of a first color, and the color filter layer 130 may selectively pass the light of the first color.

Referring to FIG. 1, a pixel area PA and the light blocking area BA are defined in the substrate 110. The pixel area PA is an area through which light is emitted, and is surrounded by the light blocking area BA. The pixel area PA may be divided into the first pixel area PA1, a second pixel area PA2, and a third pixel area PA3 according to the color of the emitted light. In one embodiment, for example, the first pixel area PA1 may be an area through which light of a first color (see Lr of FIG. 3) is emitted, the second pixel area PA2 may be an area through which light of a second color (see Lg of FIG. 3) is emitted, and the third pixel area PA3 may be an area through which light of a third color (see Lb of FIG. 3) is emitted. FIG. 1 merely shows the arrangement of the first to third pixel areas PA1, PA2, and PA3 in one embodiment, and the disclosure is not limited thereto. The first to third pixel areas PA1, PA2, and PA3 may be arranged in various shapes corresponding to the arrangement of pixels of the display device.

The light blocking area BA is an area through which light is not emitted, and may be arranged in a mesh shape between the first to third pixel areas PA1, PA2, and PA3.

The substrate 110 is a transparent substrate in which the light of the first color emitted from the first color conversion layer 160 may be emitted through the first pixel area PA1. The substrate 110 is not particularly limited as long as the substrate 110 is commonly used, but may include, for example, an insulating material such as glass, plastic, or crystal. The substrate 110 may include, for example, an organic polymer material such as polycarbonate (PC), polyethylene terephthalate (PET), polyethylene (PE), polypropylene (PP), polysulfone (PSF), polymethyl methacrylate (PMMA), triacetyl cellulose (TAC), cycloolefin polymer (COP), or cycloolefin copolymer (COC). The substrate 110 may be selected considering mechanical strength, thermal stability, transparency, surface smoothness, ease of handling, waterproofness, and the like.

The light blocking layer 120 may be on the light blocking area BA. The light blocking layer 120 may be provided in a form of a thin-film on the light blocking area BA. When light is emitted through the light blocking area BA, light leakage may occur in the display device. The light blocking layer 120 may prevent light leakage caused because light is emitted to the outside through the light blocking area BA.

The light blocking layer 120 may have various colors including black or white. In an embodiment where the light blocking layer 120 is black, the light blocking layer 120 may include a black matrix. In an embodiment where the light blocking layer 120 is white, the light blocking layer 120 may include an organic insulating material such as a white resin. The light blocking layer 120 may include an opaque inorganic insulating material such as CrOx or MoOx, or an opaque organic insulating material such as a black resin.

The color filter layer 130 may be arranged to cover edges of the light blocking layer 120. The color filter layer 130 may be an organic material pattern including a dye or a pigment. The color filter layer 130 may selectively transmit only light of a specific color.

The light reflection layer 140 may be on the color filter layer 130. The light reflection layer 140 may include a material that scatters and/or reflects light. The light reflection layer 140 may include, for example, a metal material such as Cu, Al, Mo, Ti, Ag, Ni, Mn, Au, or Cr, and may be defined by a single layer or multiple layers.

The light reflection layer 140 may scatter and/or reflect light incident from the first color conversion layer 160. The light reflection layer 140 is arranged to overlap the light blocking layer 120. In an overlapping area OA in which the light reflection layer 140 and the light blocking layer 120 overlap each other, an end 140a of the light reflection layer 140 and an end 120a of the light blocking layer 120 coincide with each other. That is, in order to prevent the aperture ratio of the pixel area PA from decreasing, the end 140a of the light reflection layer 140 is formed not to exceed the end 120a of the light blocking layer 120.

The light blocking layer 120 generally absorbs light. As a comparative example, when the light reflection layer 140 is not provided, the light blocking layer 120 located in the overlapping area OA absorbs light incident from the first color conversion layer 160. In this case, light loss occurs because part of the light emitted from the first color conversion layer 160 is absorbed by the light blocking layer 120. According to an embodiment of the disclosure, the color filter 100 includes the light reflection layer 140 between the color filter layer 130 and the first color conversion layer 160. The light reflection layer 140 may be arranged to overlap the light blocking layer 120 and may scatter and/or reflect light incident onto the light blocking layer 120. Also, because the end 140a of the light reflection layer 140 is formed not to exceed the end 120a of the light blocking layer 120, a decrease in the aperture ratio of the pixel area PA may be prevented.

The partition wall 150 is on the light blocking area BA. The partition wall 150 blocks light emitted from the first color conversion layer 160 from being introduced into an adjacent pixel area. The partition wall 150 is on the light blocking layer 120 and may come into contact with the side surfaces of the color filter layer 130 and the first color conversion layer 160. The partition wall 150 may include a material that scatters and/or reflects light. The partition wall 150 may include, for example, MTO, Ti, $TiO_2$, Cu, or the like, but is not limited thereto, and a material capable of reflecting, deposition, coating, and/or printing may be variously used.

A planarization layer 190 may be on the substrate 110 and cover the first color conversion layer 160. The planarization layer 190 may include a transparent material so that incident light may be irradiated to the first color conversion layer 160. The planarization layer 190 may include, for example, a transparent organic material such as a polyimide resin, an acrylic resin, or a resist material. The planarization layer 190 may be formed by a wet process such as slit coating or spin coating, a dry process such as chemical vapor deposition or vacuum deposition, and the like. The embodiment is not limited to these materials and forming methods.

According to an alternative embodiment, the planarization layer 190 may be omitted.

Referring to FIGS. 1 and 3, an embodiment of the color filter 100 includes a plurality of pixels that emits light of different colors from each other.

The substrate 110 may include the first pixel area PA1, the second pixel area PA2, and the third pixel area PA3, which are apart from each other, and the light blocking area BA between the first to third pixel areas PA1, PA2, and PA3. The first color conversion layer 160 is on the first pixel area PA1 and converts the incident light Lib into light Lr of a first color. The second color conversion layer 170 is on the second pixel area PA2 and converts the incident light Lib into light Lg of a second color. The color filter 100 may further include a transmission layer 180. The transmission layer 180 may be on the third pixel area PA3 and may transmit the incident light Lib.

In an embodiment, as shown in FIG. 3, the color filter 100 may receive the incident light Lib and emit the light Lr, Lg, and Lb of the first to third colors. The light Lr of the first color may be red light, the light Lg of the second color may be green light, and the light Lb of the third color may be blue light. The red light has a peak wavelength of 580 nanometers (nm) or more and less than 750 nm. The green light has a peak wavelength of 495 nm or more and less than 580 nm. The blue light has a peak wavelength of 400 nm or more and less than 495 nm. The incident light Lib may be the light Lb of the third color. According to an alternative embodiment, the first color may be a color other than red, green, and blue (e.g., cyan, magenta, or yellow). Hereinafter, it is assumed that the first color conversion layer 160 converts blue light into red light.

The color filter layer 130 may include a first color filter layer 130a, a second color filter layer 130b, and a third color filter layer 130c. The first color filter layer 130a may be on the first pixel area PA1, the second color filter layer 130b may be on the second pixel area PA2, and the third color filter layer 130c may be on the third pixel area PA3. The first color filter layer 130a may selectively transmit only the light Lr of the first color, the second color filter layer 130b may selectively transmit only the light Lg of the second color, and the third color filter layer 130c may selectively transmit only the light Lb of the third color.

The first and second color conversion layers 160 and 170 and the transmission layer 180 may be on the color filter layer 130. The light reflection layer 140 is between the first color filter layer 130a and the first color conversion layer 160 and between the second color filter layer 130b and the second color conversion layer 170. In an embodiment, as shown in FIG. 3, the light reflection layer 140 is apart on the light blocking area BA between adjacent pixel areas. According to an alternative embodiment, the light reflection layers 140 may be connected to each other on the light blocking area BA between adjacent pixel areas.

In an embodiment, as shown in FIG. 3, the light reflection layer 140 may not be between the third color filter layer 130c and the transmission layer 180. The light reflection layer 140 reflects light partially absorbed by the light blocking layer 120 among pieces of light emitted from the first and second color conversion layers 160 and 170 in all directions, so that the light is absorbed again by the first and second color conversion layers 160 and 170. Therefore, the light reflection layer 140 may not be on the third pixel area PA3 in which the transmission layer 180 is arranged.

The light reflection layer 140 may include a material that scatters and/or reflects light. As described above with reference to FIG. 2, the light reflection layer 140 may be arranged to overlap the light blocking layer 120 on the first and second pixel areas PA1 and PA2 and may scatter and/or reflect light incident onto the light blocking layer 120 located in the overlapping area OA. Also, because the end 140a of the light reflection layer 140 is formed not to exceed the end 120a of the light blocking layer 120, a decrease in the aperture ratio of the pixel area PA may be prevented.

Most of the light Lr of the first color emitted from the first color conversion layer 160 and scattered and/or reflected from the light reflection layer 140, for example, more than half the light Lr of the first color may be re-incident on the first color conversion layer 160. In embodiments of the invention, more than half the light Lr of the first color reflected by the light reflection layer 140 is re-incident onto the first color conversion layer 160. In such embodiments, most of the light Lg of the second color emitted from the second color conversion layer 170 and scattered and/or reflected from the light reflection layer 140, for example, more than half the light Lg of the second color may be re-incident on the second color conversion layer 170. In such embodiments, as more than half the light Lg of the second color reflected by the partition wall 150 is re-incident onto the second color conversion layer 170.

The partition wall 150 may be on the light blocking area BA and may be between the first color conversion layer 160, the second color conversion layer 170, and the transmission layer 180 in a horizontal direction or a direction perpendicular to a thickness direction of the substrate 110. The partition wall 150 may be arranged to overlap the light blocking layer 120.

The partition wall 150 may include a material that scatters and/or reflects the pieces of light Lr, Lg, and Lb of the first to third colors Lr, Lg, and Lb. The partition wall 150 may scatter and/or reflect light incident from the first and second color conversion layers 160 and 170 and the transmission layer 180. Therefore, the partition wall 150 may reduce light loss due to light absorption.

The partition wall 150 may prevent the light Lr of the first color emitted from the first color conversion layer 160 from being irradiated to the second color conversion layer 170 or the transmission layer 180, may prevent the light Lg of the second color emitted from the second color conversion layer 170 from being irradiated to the first color conversion layer 160 or the transmission layer 180, or may prevent the light Lb of the third color emitted from the transmission layer 180 from being irradiated to the first color conversion layer 160 or the second color conversion layer 170.

Figure 4:
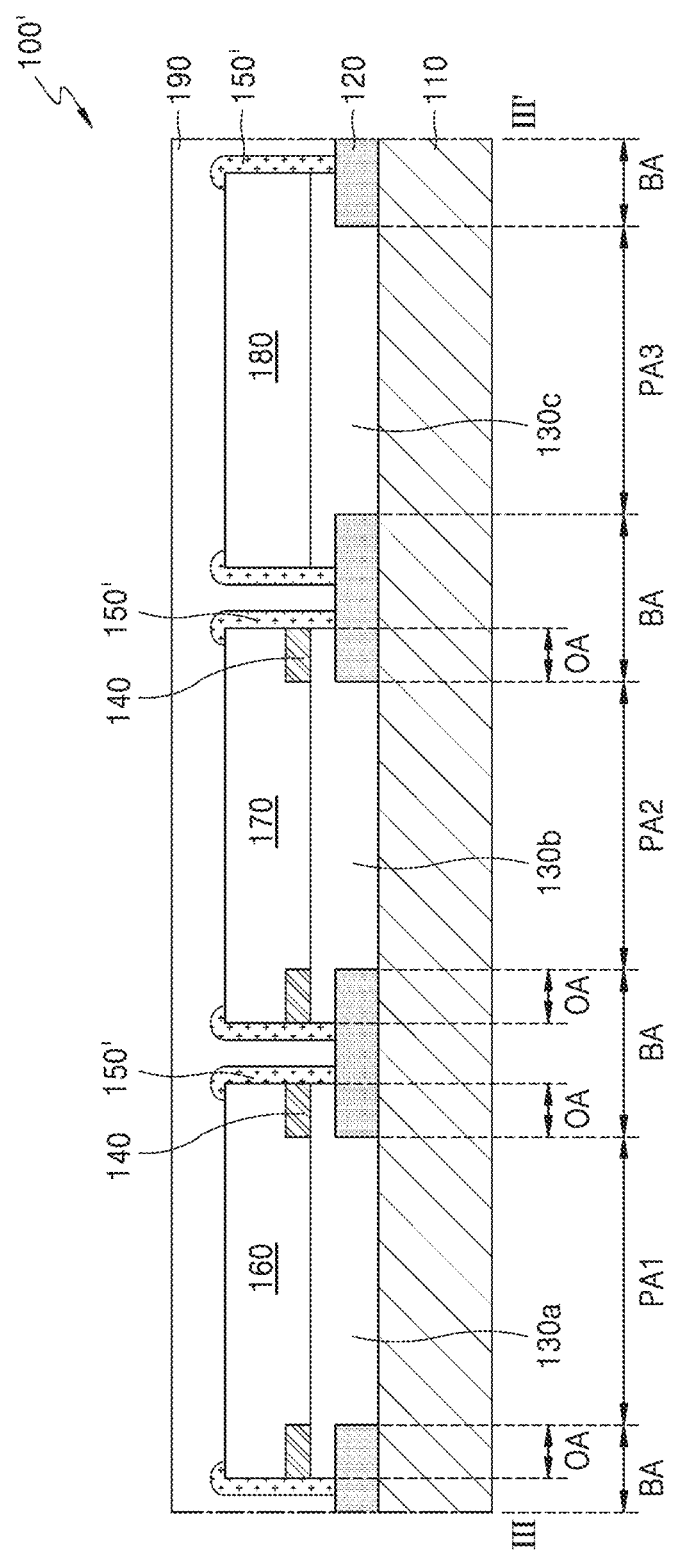
FIG. 4 is a schematic cross-sectional view of a color filter according to an alternative embodiment of the disclosure.

FIG. 4 is a schematic cross-sectional view of a color filter according to an alternative embodiment of the disclosure.

Referring to FIG. 4, a color filter 100' of FIG. 4 differs from the embodiment of FIG. 3 in a structure of a partition wall 150'. The configuration except for the partition wall 150' is the same as that of the embodiment of FIG. 3, and the following description will be given focusing on differences in the structure of the partition wall 150'.

The partition wall 150' may be on the light blocking area BA, and may be apart for each pixel. The partition wall 150' may be arranged to cover side surfaces of the first and second color conversion layers 160 and 170. The partition wall 150' may extend from the side surfaces of the first and second color conversion layers 160 and 170 to the light blocking layer 120, and may cover the side surface of the light reflection layer 140 and the side surfaces of the first and second color filter layers 130a and 130b. That is, because the partition wall 150' reflects light emitted from the first and second color conversion layers 160 and 170 to be re-incident onto the first and second color conversion layers 160 and 170, the partition wall 150' may be provided to cover the side surfaces of the first and second color conversion layers 160 and 170.

FIG. 4 illustrates an embodiment where the partition wall 150' covers all the side surfaces of the first and second color conversion layers 160 and 170 and the transmission layer 180, but according to another alternative embodiment, the partition wall 150' may not cover the side surface of the transmission layer 180.

The planarization layer 190 may be disposed to fill a space on the light blocking area BA between adjacent partition walls 150'.

Figure 5:
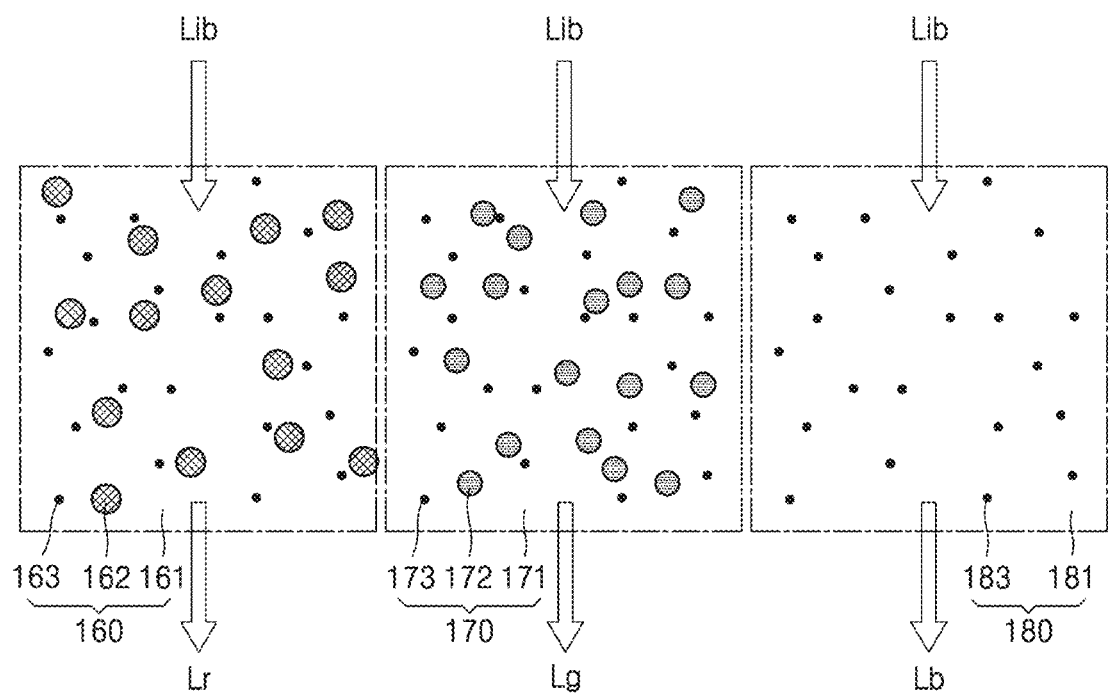
FIG. 5 is a schematic cross-sectional view of a color filter according to another alternative embodiment of the disclosure.

FIG. 5 is an enlarged cross-sectional view of the first and second color conversion layers and the transmission layer of the color filter, according to an embodiment of the disclosure.

Referring to FIG. 5, the first color conversion layer 160 converts incident blue light Lib into the light Lr of the first color. The first color conversion layer 160 may include a first photosensitive polymer 161 in which first quantum dots 162 and first scattering particles 163 are dispersed.

The first quantum dots 162 may be excited by the incident blue light Lib to isotropically emit the light Lr of the first color having a wavelength longer than that of the blue light. The first photosensitive polymer 161 may include an organic material having light-transmitting properties. The first scattering particles 163 may scatter incident blue light Lib that has not been absorbed by the first quantum dots 162, so that more of the first quantum dots 162 are excited. Therefore, the color conversion rate of the first color conversion layer 160 may be increased. The first scattering particles 163 may include, for example, titanium oxide ($TiO_2$) or metal particles. The first quantum dots 162 may include a Group II-VI compound, a Group III-V compound, a Group IV-VI compound, a Group IV compound, or any combination thereof.

The Group II-VI compound may include: a binary compound selected from CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-V compound may include: a binary compound selected from GaN, GaP, GaAs, GaSb, AlN, AlP, AlAs, AlSb, InN, InP, InAs, InSb, and mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The Group IV-VI compound may include: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof.

The Group IV compound may include: an elemental compound selected from of Si, Ge, and any mixture thereof; and a binary compound selected from SiC, SiGe, and any mixture thereof.

The second color conversion layer 170 converts the incident blue light Lib into the light Lg of the second color. The second color conversion layer 170 may include a second photosensitive polymer 171 in which second quantum dots 172 and second scattering particles 173 are dispersed.

The second quantum dots 172 may be excited by the incident blue light Lib to isotropically emit the light Lg of the second color having a wavelength longer than that of the blue light. The second photosensitive polymer 171 may include an organic material having light-transmitting properties and may include the same material as that of the first photosensitive polymer 161. The second scattering particles 173 may scatter incident blue light Lib that has not been absorbed by the second quantum dots 172, so that more of the second quantum dots 172 are excited. Therefore, the color conversion rate of the second color conversion layer 170 may be increased. The second scattering particles 173 may include, for example, titanium oxide ($TiO_2$) or metal particles, and may include the same material as that of the first scattering particles 163. The second quantum dots 172 may include a Group II-VI compound, a Group III-V compound, a Group IV-VI compound, a Group IV compound, or any combination thereof. The second quantum dots 172 may include the same material as that of the first quantum dots 162. In this case, the size of the second quantum dots 172 may be less than the size of the first quantum dots 162.

The transmission layer 180 may transmit the incident blue light Lib and emit the incident blue light Lib toward the substrate 110. The transmission layer 180 may include a third photosensitive polymer 181 in which third scattering particles 183 are dispersed. The third photosensitive polymer 181 may include, for example, an organic material having light-transmitting properties, such as a silicone resin or an epoxy resin, and may include the same material as that of the first and second photosensitive polymers 161 and 171. The third scattering particles 183 may scatter and emit the incident blue light Lib, and may include the same material as that of the first and second scattering particles 163 and 173.

Figure 6:
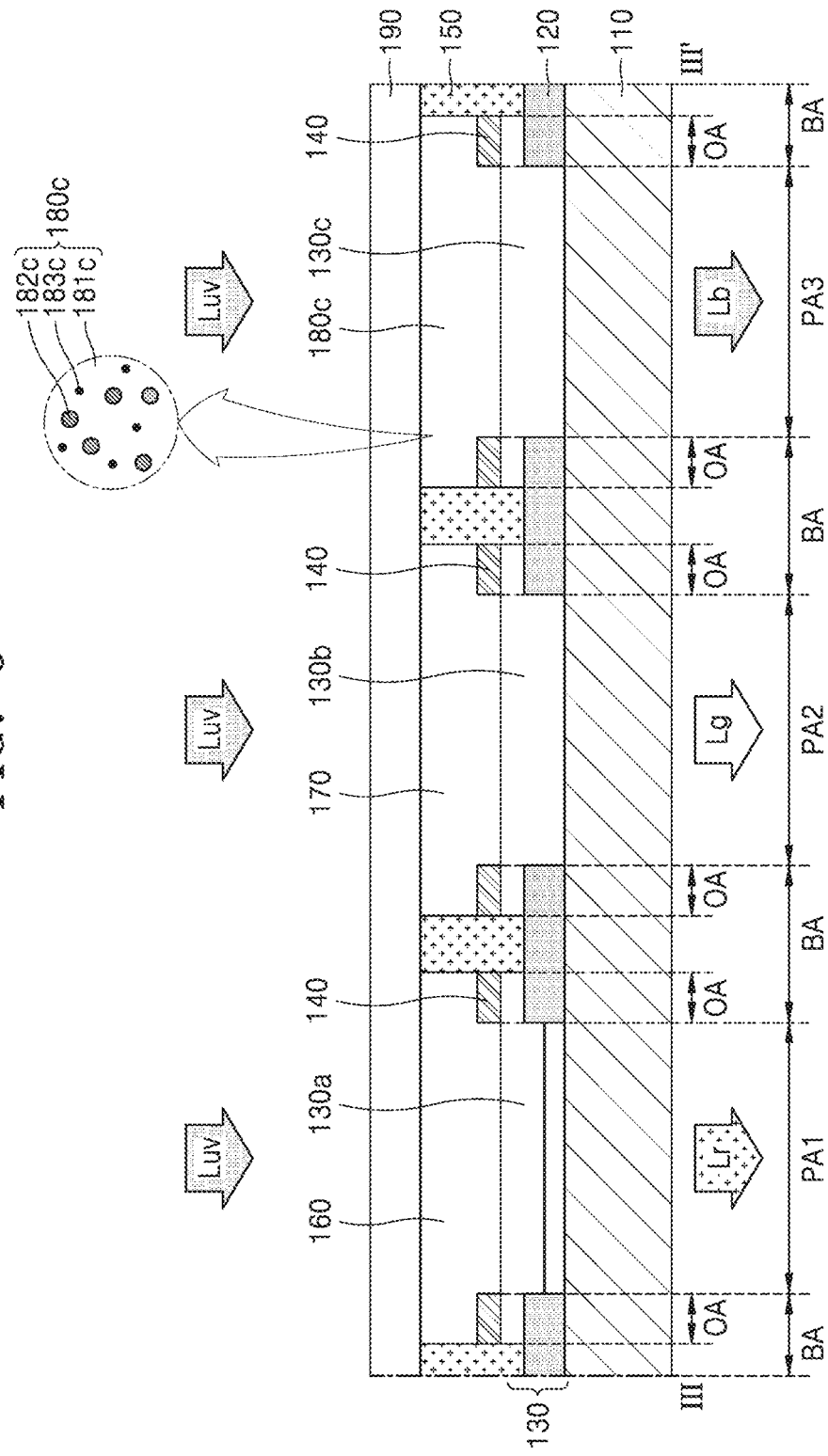
FIG. 6 is an enlarged cross-sectional view of first and second color conversion layers and a transmission layer of a color filter, according to an embodiment of the disclosure.

FIG. 6 is a schematic cross-sectional view of a color filter according to another alternative embodiment of the disclosure.

Referring to FIG. 6, an embodiment of a color filter 100" may receive ultraviolet light Luv as incident light. Therefore, the color filter 100" of FIG. 6 differs from the embodiment of FIG. 3 in a structure of a third pixel area PA3. The configuration except for the third pixel area PA3 is the same as that of the embodiment of FIG. 3, and the following description will be given focusing on differences in the third pixel area PA3.

A third color conversion layer 180c may be on the third pixel area PA3. The third color conversion layer 180c may convert incident light into light of a third color.

Red light emitted from a first color conversion layer 160 is emitted to the outside through a first pixel area PA1, green light emitted from a second color conversion layer 170 is emitted to the outside through a second pixel area PA2, and blue light emitted from the third color conversion layer 180c is emitted to the outside through the third pixel area PA3.

The third color conversion layer 180c is on a third color filter layer 130c, converts incident ultraviolet light Luv into blue light, and emits the blue light toward a substrate 110. The third color conversion layer 180c may include a third photosensitive polymer 181c in which third quantum dots 182c are dispersed. The third color conversion layer 180c may further include third scattering particles 183c dispersed in the third photosensitive polymer 181c.

The third color filter layer 130c may selectively pass the blue light emitted from the third color conversion layer 180c. The third color filter layer 130c may absorb or reflect red light and green light so that light of a color other than blue light (e.g., red light and green light) is not emitted to the outside through the third pixel area PA3.

FIGS. 7A to 7D are cross-sectional views schematically illustrating a process of manufacturing a color filter, according to an embodiment of the disclosure.

Figure 7A:
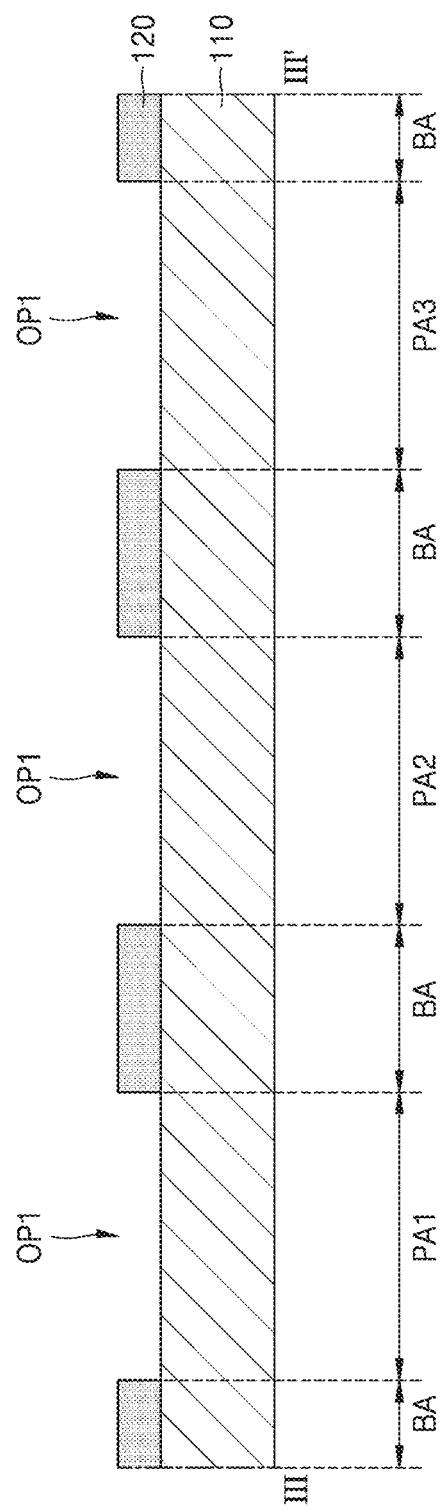
FIGS. 7A to 7D are cross-sectional views schematically illustrating a process of manufacturing a color filter, according to an embodiment of the disclosure.

Referring to FIG. 7A, in an embodiment of a process of manufacturing a color filter, a light blocking layer 120 may be formed in a light blocking area BA on a substrate 110. The light blocking layer 120 may be formed by spraying organic ink, or may be formed by patterning a metal layer through a photolithography process. Therefore, a first opening OP1 may be formed in the light blocking area BA.

Figure 7B:
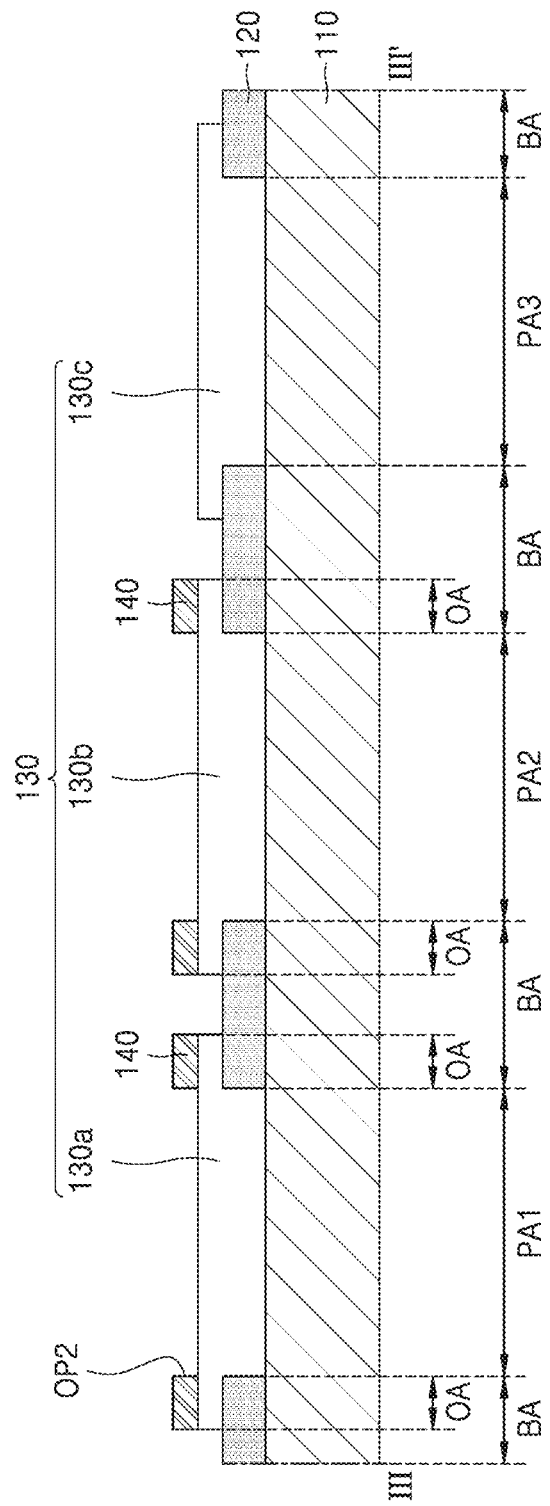

Referring to FIG. 7B, a color filter layer 130 may be formed on the substrate 110 on which the light blocking layer 120 is formed. The color filter layer 130 may be formed in the first opening OP1 of the light blocking layer 120.

The color filter layer 130 may be formed by repeating a process of applying a color photoresist on the substrate 110 and selectively patterning the color photoresist. In one embodiment, for example, a first color photoresist may be applied and etched to form a first color filter layer 130a, a second color photoresist may be applied and etched to form a second color filter layer 130b, and a third color photoresist may be applied and etched to form a third color filter layer 130c. The order of forming the first to third color filter layers 130a, 130b, and 130c is not limited to a specific order. The color photoresist may include a photopolymerization type photosensitive composition such as a photopolymerization initiator, a monomer, or a binder, and an organic pigment that implements a color. The first color filter layer 130a, the second color filter layer 130b, and the third color filter layer 130c may be formed in, for example, a stripe type, a mosaic type, and the like according to an arrangement scheme.

In such an embodiment, as shown in FIG. 7B, the color filter layer 130 is formed to have a height (thickness) greater than that of the light blocking layer 120, but embodiments of the disclosure are not limited thereto. In one embodiment, for example, the color filter layer 130 may be formed to have a height (thickness) less than or equal to that of the light blocking layer 120.

A light reflection layer 140 may be on the first and second color filter layers 130a and 130b. Each of the first to third color filter layers 130a, 130b, and 130c may be formed to cover the end of the light blocking layer 120, and the light reflection layer 140 may be arranged to overlap the light blocking layer 120 on the first and second color filter layers 130a and 130b. An area in which the light reflection layer 140 and the light blocking layer 120 overlap each other may be defined as an overlapping area OA. The light reflection layer 140, the color filter layer 130, and the light blocking layer 120 may simultaneously overlap each other on the overlapping area OA.

A second opening OP2 exposing each of the first and second pixel areas PA1 and PA2 may be formed in the light reflection layer 140. The second opening OP2 may be formed to have the same size as that of the first opening OP1 of the light blocking layer 120. That is, because the first to third pixel areas PA1, PA2, and PA3 are defined by the first opening OP1 of the light blocking layer 120, forming the second opening OP2 to have the same size as that of the first opening OP1 means that the light reflection layer 140 does not affect the aperture ratio.

The light reflection layer 140 is not formed on the third color filter layer 130c. The light reflection layer 140 reflects light partially absorbed by the light blocking layer 120 among pieces of light emitted from the first and second color conversion layers 160 and 170 in all directions, so that the light is absorbed again by the first and second color conversion layers 160 and 170. Therefore, the light reflection layer 140 may not be on the third pixel area PA3 in which the transmission layer 180 is arranged.

Figure 7C:
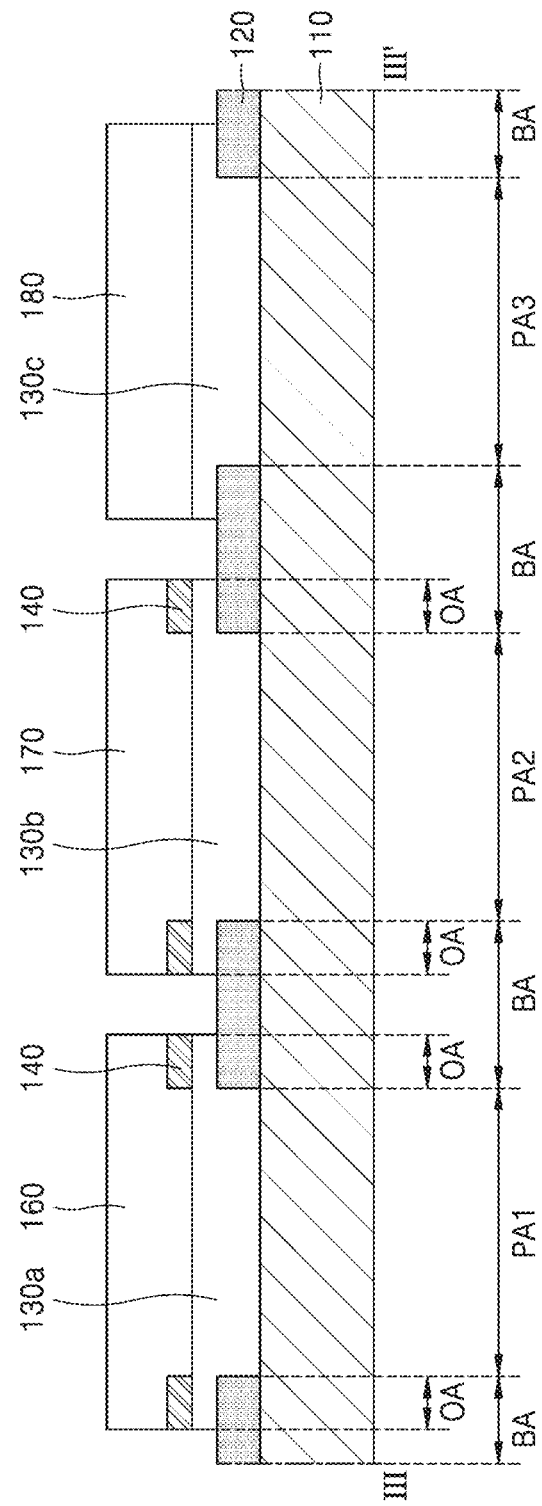

Referring to FIG. 7C, a first color conversion layer 160 is formed on the first pixel area PA1, a second color conversion layer 170 is formed on the second pixel area PA2, and a transmission layer 180 is formed on the third pixel area PA3.

According to an embodiment, a first quantum dot-photoresist may be applied on the substrate 110 and patterned to form the first color conversion layer 160 in the first pixel area PA1. A second quantum dot-photoresist may be applied on the substrate 110 and patterned to form the second color conversion layer 170 in the second pixel area PA2. A third photoresist may be applied on the substrate 110 and patterned to form the transmission layer 180 in the third pixel area PA3. The order of forming the first and second color conversion layers 160 and 170 and the transmission layer 180 is not limited to a specific order.

Figure 7D:
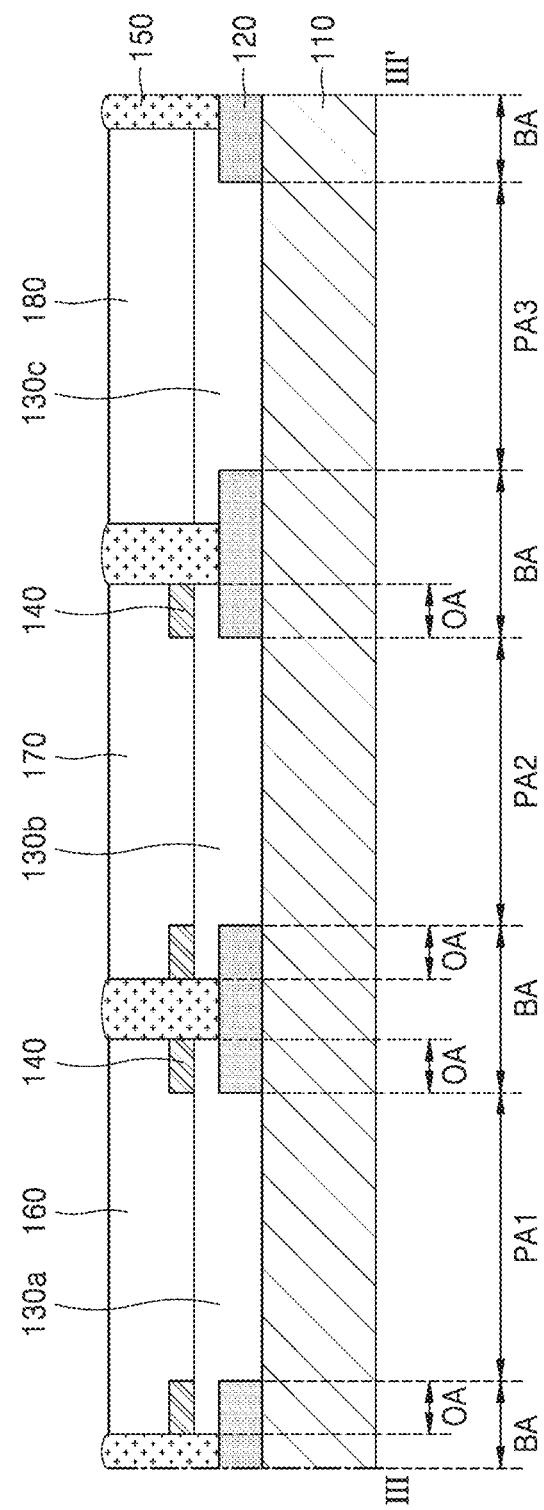

Referring to FIG. 7D, a partition wall 150 may be formed on the light blocking area BA between the first and second color conversion layers 160 and 170 and the transmission layer 180. The partition wall 150 may be formed by applying a partition wall forming material on the substrate 110 and patterning the partition wall forming material. The partition wall 150 may be formed in a single layer or multiple layers including a material that scatters and/or reflects light Lr of a first color, light Lg of a second color, and light Lb of a third color. The height (thickness) of the partition wall 150 and the concentration of the scattering material and/or the reflective material may be designed differently according to an applied electronic device.

According to an alternative embodiment, the partition wall 150 may be formed by an inkjet coating process of discharging ink onto the light blocking area BA between the first and second color conversion layers 160 and 170 and the transmission layer 180. In such an embodiment where the partition wall 150 is formed by the inkjet coating process, a photo process may not be added, a manufacturing cost may be reduced, and a process may be simplified.

Referring back to FIG. 3, a planarization layer 190 may be formed on the first and second color conversion layers 160 and 170 and the transmission layer 180.

Hereinabove, only an embodiment of the color filter has been mainly described, but the disclosure is not limited thereto. For example, it will be understood that a display device including such a color filter also falls within the scope of the disclosure.

Figure 8:
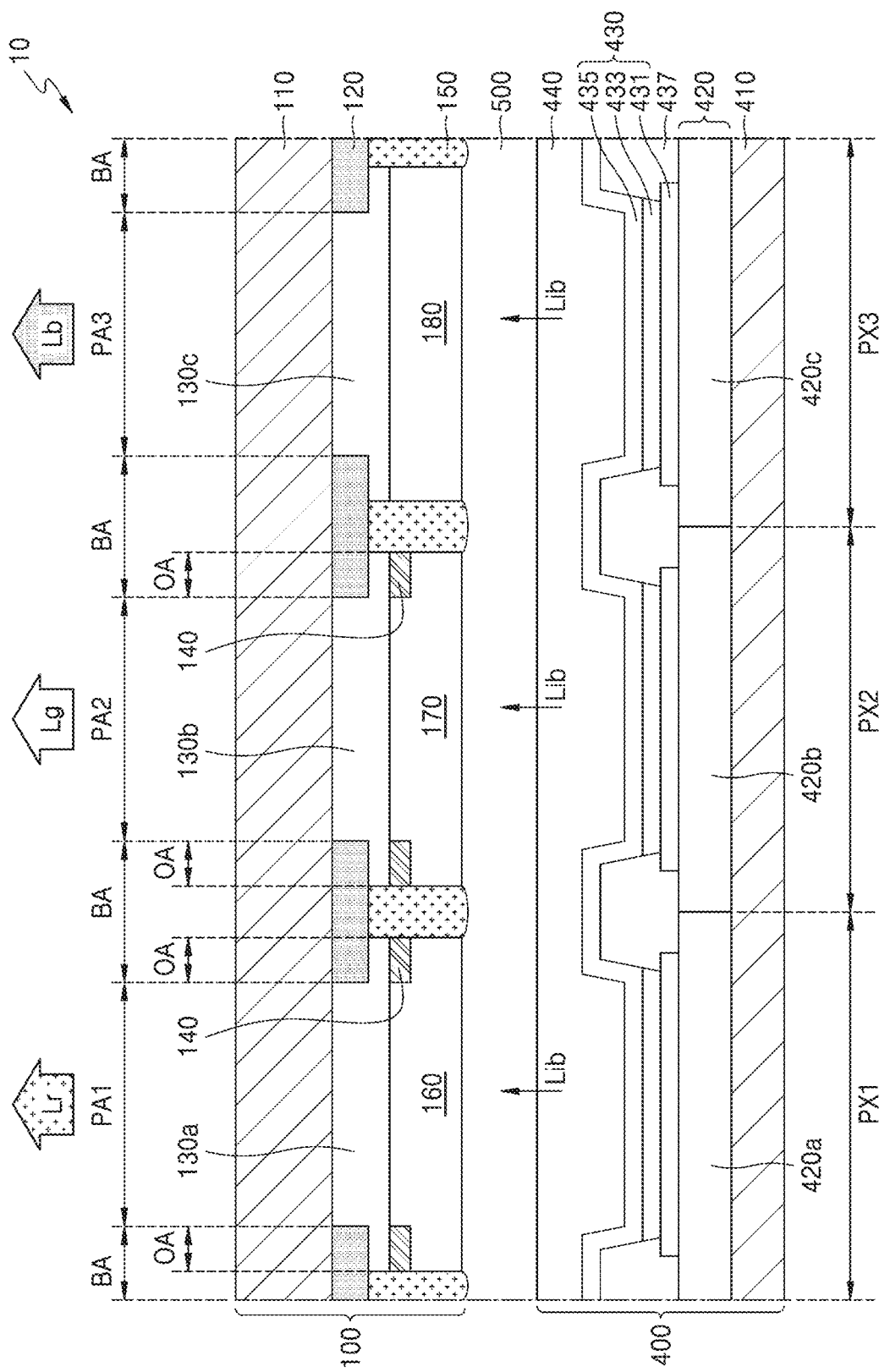
FIG. 8 is a cross-sectional view illustrating a schematic structure of a display device according to an embodiment of the disclosure.

FIG. 8 is a cross-sectional view illustrating a schematic structure of a display device according to an embodiment of the disclosure.

Figure 10:
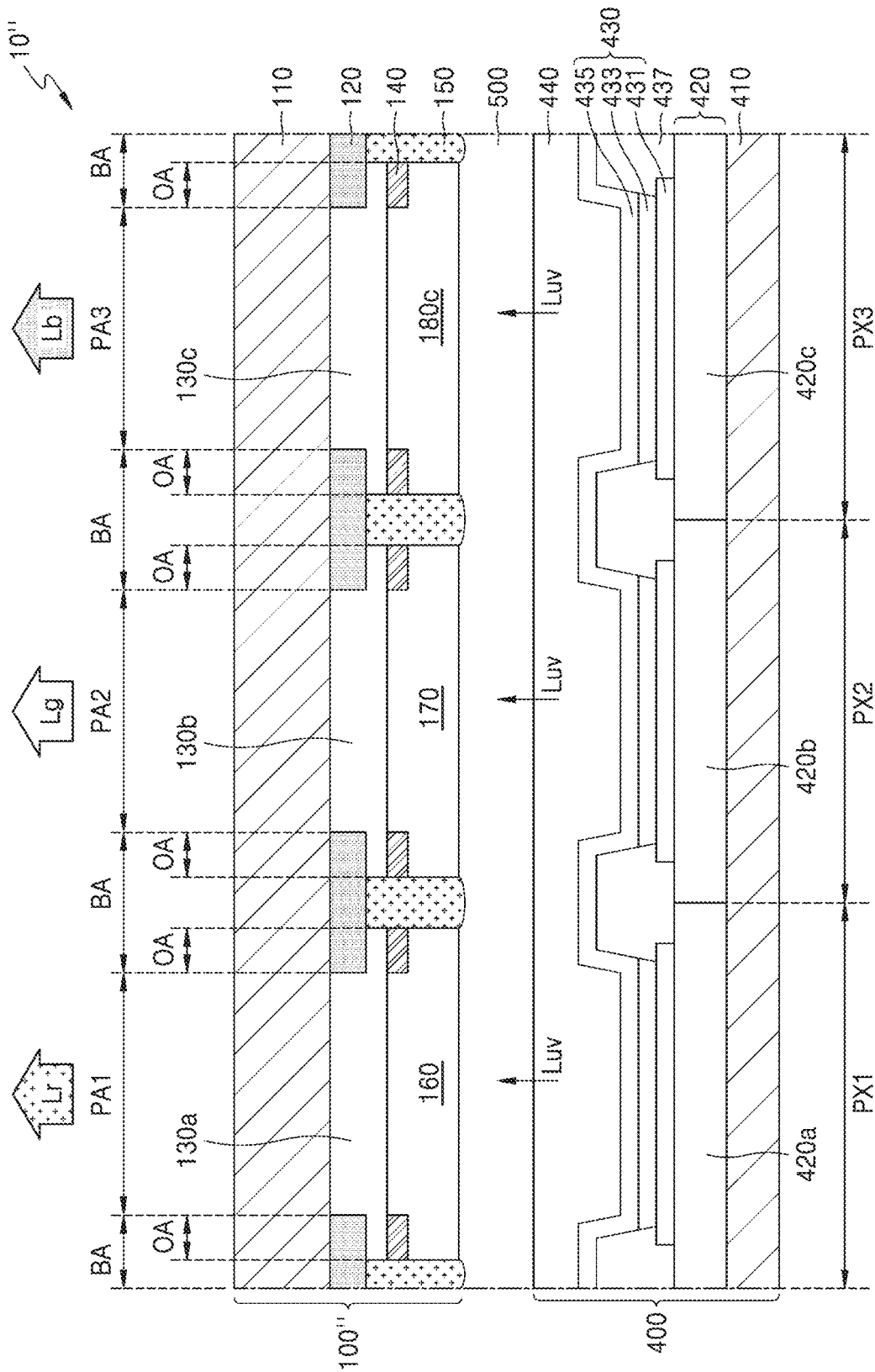
FIG. 10 is a cross-sectional view illustrating a schematic structure of a display device according to another alternative embodiment of the disclosure.

An embodiment of a display device 10 of FIG. 8 includes the color filter 100 of FIG. 3 and a display panel 400. A filling layer 500 may be further provided between the display panel 400 and the color filter 100. The filling layer 500 may include an insulating layer or an air layer including a transparent material having light-transmitting properties. In an embodiment, as shown in FIG. 8, the display device 10 may not include the planarization layer (see 190 of FIG. 3), but in an alternative embodiment, the display device 10 may include the planarization layer 190 as shown in FIG. 10.

The display panel 400 may include first to third pixels PX1, PX2, and PX3. The first pixel PX1 may include a light-emitting element 430 and a first pixel circuit 420a that controls the light-emitting element 430, the second pixel PX2 may include a light-emitting element 430 and a second pixel circuit 420b that controls the light-emitting element 430, and the third pixel PX3 may include a light-emitting element 430 and a third pixel circuit 420c that controls the light-emitting element 430.

The light-emitting element 430 may include an organic light-emitting device (OLED). The light-emitting element 430 may emit the light of the third color, for example, the incident blue light Lib, which has an amount of light controlled by the first to third pixel circuits 420a, 420b, and 420c. The light-emitting element 430 may be arranged to correspond to the first to third pixel areas PA1, PA2, and PA3 of the color filter 100. Each of the first to third pixel circuits 420a, 420b, and 420c may be on a pixel circuit layer 420 that is a lower layer of the light-emitting element 430, and may or may not at least partially overlap the light-emitting element 430.

The color filter 100 may perform color conversion on part of the incident light Lib of the third color emitted from the light-emitting elements 430 and emit the light Lr of the first color and the light Lg of the second color to the outside, and may exit part of the incident light Lib of the third color to the outside as the light Lb of the third color without color conversion.

The substrate 410 may include a material such as glass, a metal, or an organic material.

The first to third pixel circuits 420a, 420b, and 420c of the first to third pixels PX1, PX2, and PX3 may be on the substrate 410. Each of the first to third pixel circuits 420a, 420b, and 420c may include a plurality of thin-film transistors and at least one capacitor. In addition to the first to third pixel circuits 420a, 420b, and 420c, signal lines and voltage lines configured to transmit signals and driving voltages to the first to third pixels PX1, PX2, and PX3 may be on the pixel circuit layer 420. The light-emitting element 430 of the first pixel PX1 may be arranged to correspond to the first pixel area PA1 of the color filter 100. The light-emitting element 430 of the second pixel PX2 may be arranged to correspond to the second pixel area PA2 of the color filter 100. The light-emitting element 430 of the third pixel PX3 may be arranged to correspond to the third pixel area PA3 of the color filter 100.

Each of the thin-film transistors may include a semiconductor layer, a gate electrode, a source electrode, and a drain electrode. The semiconductor layer may include amorphous silicon or may include polycrystalline silicon. The semiconductor layer may include an oxide semiconductor. The semiconductor layer may include a source region, a drain region, and a channel region therebetween.

The light-emitting element 430 may be on the pixel circuit layer 420. The light-emitting element 430 may include a pixel electrode 431, a middle layer 433, and an opposite electrode 435.

The pixel electrode 431 may be connected to the source electrode or the drain electrode of the thin-film transistor of a corresponding pixel circuit. The pixel electrode 431 may be exposed through an opening of a pixel defining layer 437, and an edge of the pixel electrode 431 may be covered by the pixel defining layer 437.

The middle layer 433 may be on the pixel electrode 431 exposed by the pixel defining layer 437. The middle layer 433 may include an organic emission layer, and the organic emission layer may include a low molecular weight organic material or a high molecular weight organic material. The middle layer 433 may optionally further include, in addition to the organic light-emitting layer, a functional layer such as a hole transport layer (HTL), a hole injection layer (HIL), an electron transport layer (ETL), and an electron injection layer (EIL).

The opposite electrode 435 may be arranged to cover the middle layer 433 and the pixel defining layer 437. The opposite electrode 435 may include a transparent or semi-transparent electrode. In one embodiment, for example, the opposite electrode 435 may include a metal thin-film having a low work function. The opposite electrode 435 may include a transparent conductive oxide (TCO).

An encapsulation layer 440 may be on the light-emitting element 430. The encapsulation layer 440 may cover the opposite electrode 435 and may be on the entire surface of the substrate 410. The encapsulation layer 440 may include at least one inorganic encapsulation layer including an inorganic material and at least one organic encapsulation layer including an organic material. According to an embodiment, the encapsulation layer 440 may have a structure in which a first inorganic encapsulation layer, an organic encapsulation layer, and a second inorganic encapsulation layer are sequentially stacked one on another.

The color filter 100 may include a substrate 110, a light blocking layer 120 and a light reflection layer 140 partitioning first to third pixel areas PA1, PA2, and PA3 for different colors, a partition wall 150, and first to third color filter layers 130a, 130b, and 130c configured to selectively transmit light of different colors.

A first color conversion layer 160 configured to convert incident blue light Lib into red light Lr may be arranged in the first pixel area PA1, a second color conversion layer 170 configured to convert incident blue light Lib into green light LG may be arranged in the second pixel area PA2, and a transmission layer 180 configured to transmit incident blue light Lib as blue light Lb as it is may be arranged in the third pixel area PA3.

The light Lb of the third color emitted from the light-emitting element 430 controlled by the first pixel circuit 420a of the first pixel PX1 is converted into the light Lr of the first color through the first color conversion layer 160 and emitted to the outside through the substrate 110. The light Lb of the third color emitted from the light-emitting element 430 controlled by the second pixel circuit 420b of the second pixel PX2 is converted into the light Lg of the second color through the second color conversion layer 170 and emitted to the outside through the substrate 110. The light Lb of the third color emitted from the light-emitting element 430 controlled by the third pixel circuit 420c of the third pixel PX3 is emitted to the outside through the transmission layer 180 and the substrate 110 without color conversion.

An image of the incident blue light Lib emitted from the display panel 400 is incident onto the color filter 100 and is converted into red light Lr, green light Lg, and blue light Lb. In this manner, a color image is displayed.

According to the embodiment of the disclosure, the partition wall 150 and the light reflection layer 140 may prevent color mixing by blocking light incident between the adjacent color conversion layers and the transmission layers. Therefore, a color matching rate and color reproducibility may be improved, light efficiency may be improved through light recycling, and thus, power consumption may be reduced.

Figure 9:
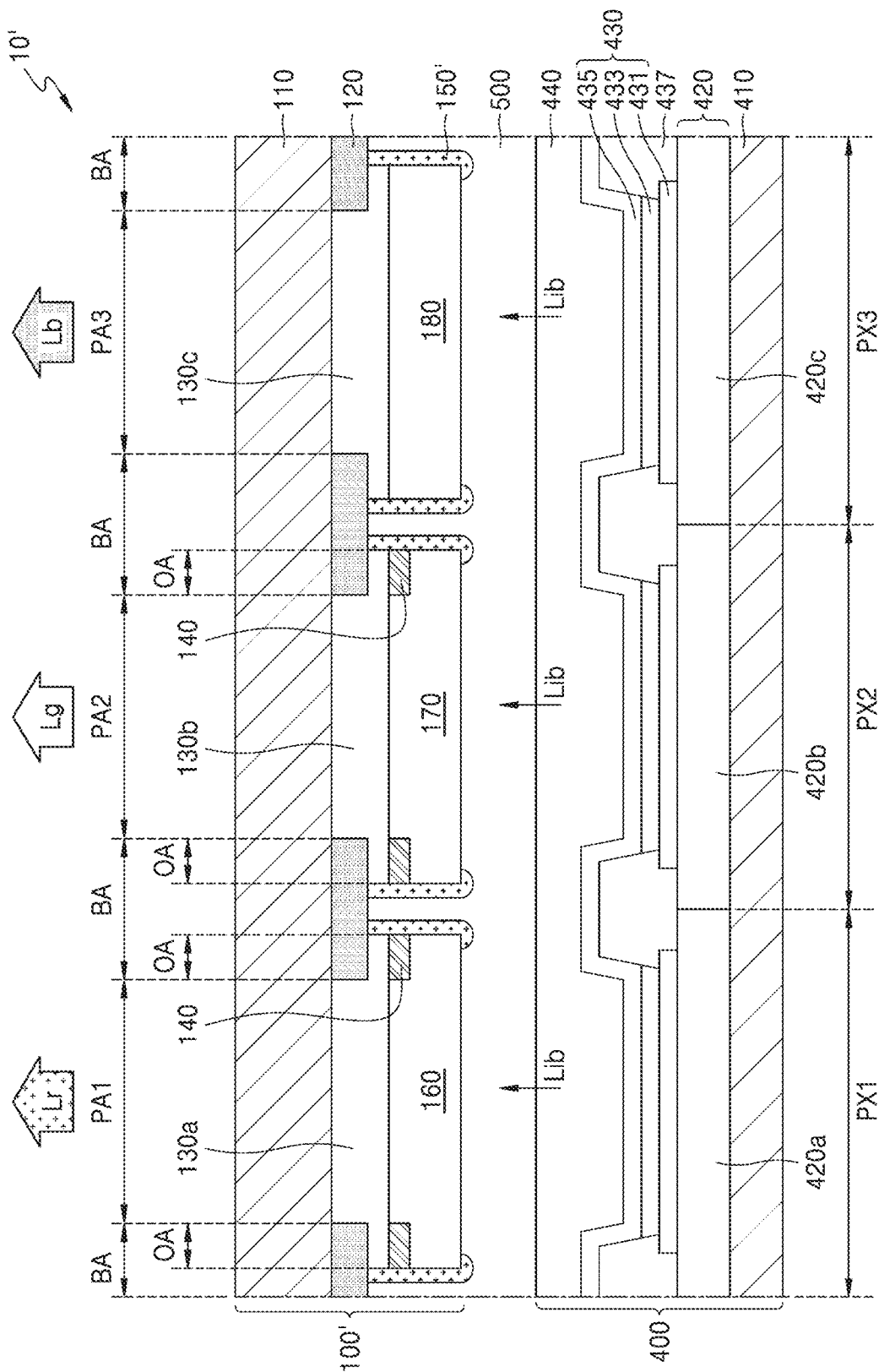
FIG. 9 is a cross-sectional view illustrating a schematic structure of a display device according to an alternative embodiment of the disclosure.

FIG. 9 is a cross-sectional view illustrating a schematic structure of a display device according to an alternative embodiment of the disclosure.

An embodiment of a display device 10' of FIG. 9 includes the color filter 100' of FIG. 4 and a display panel 400. Because the color filter 100' is the same as that of FIG. 4 and the display panel 400 is the same as that of FIG. 8, the above descriptions are incorporated herein.

FIG. 10 is a cross-sectional view illustrating a schematic structure of a display device according to another alternative embodiment of the disclosure.

An embodiment of a display device 10" of FIG. 10 includes the color filter 100" of FIG. 6 and a display panel 400. Because the color filter 100" is the same as that of FIG. 6, the above descriptions are incorporated herein.

The display panel 400 is similar to that of FIG. 8 described above, but a light-emitting element 430 may emit ultraviolet light Luv. In such an embodiment, as described above with reference to FIG. 6, the color filter 100" includes a third color conversion layer 180c, and the third color conversion layer 180c may include a third photosensitive polymer 181c in which third quantum dots 182c and third scattering particles 183c are dispersed. The third color conversion layer 180c may convert incident light, that is, ultraviolet light Luv, into light of a third color (e.g., blue light).

Figure 11:
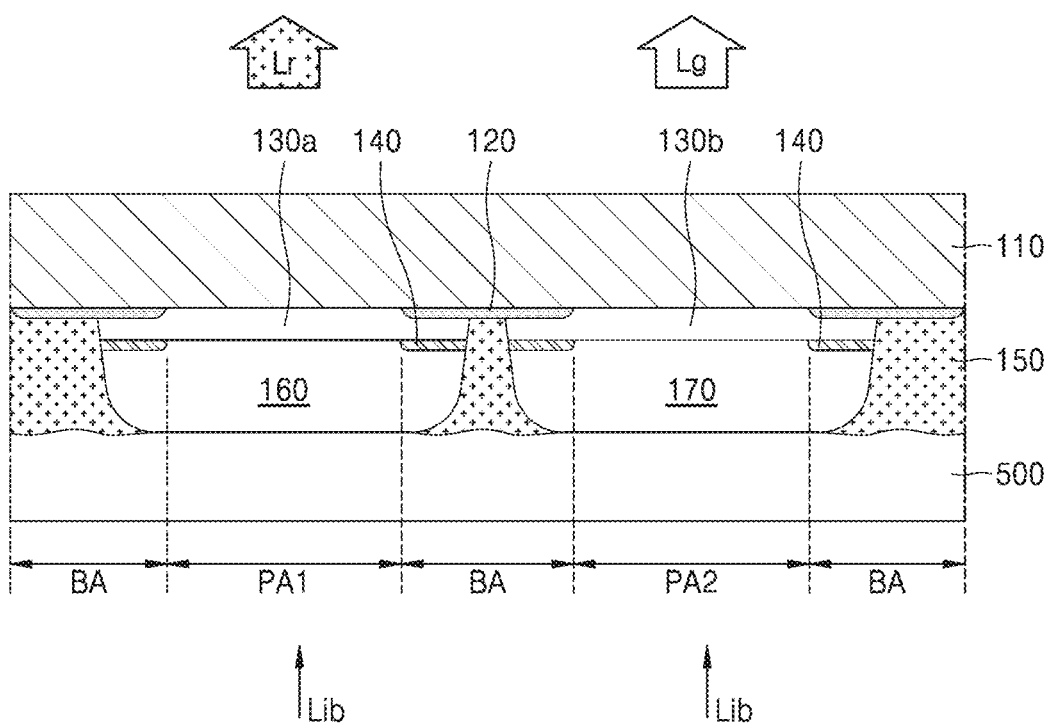
FIGS. 11 and 12 are cross-sectional views of color filters according to other alternative embodiments of the disclosure.
Figure 12:
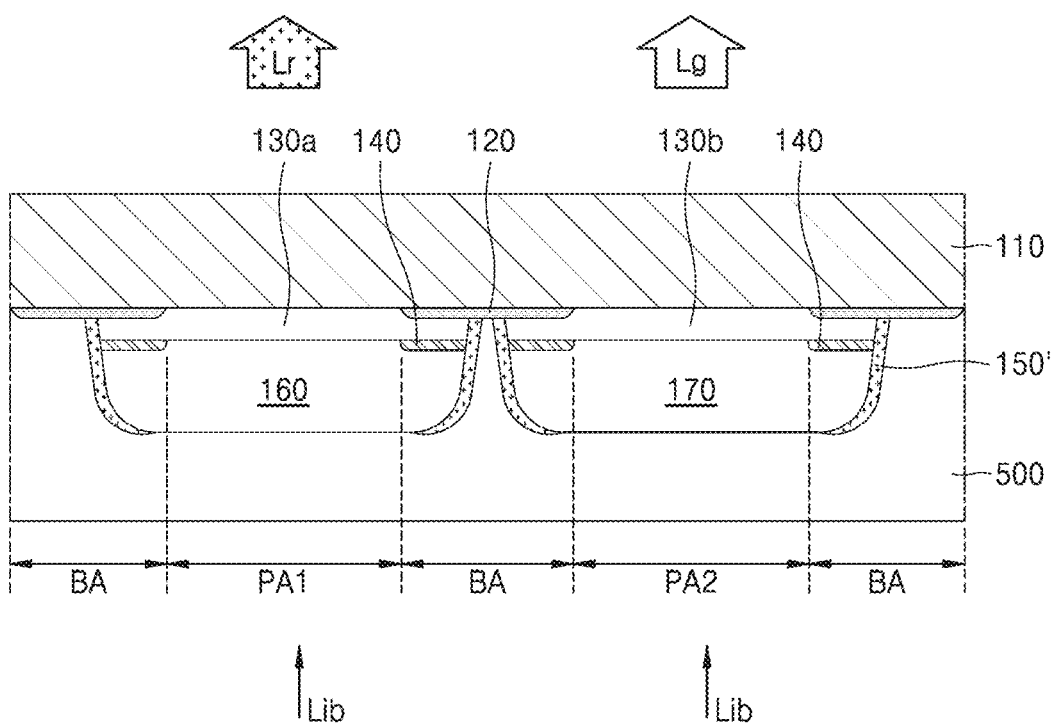

FIGS. 11 and 12 are cross-sectional views of color filters according to other alternative embodiments of the disclosure. FIGS. 11 and 12 illustrate parts of FIGS. 3 and 4 in detail, respectively.

Referring to FIG. 11, a substrate 110 may include a first pixel area PA1 and a second pixel area PA2, which are apart from each other, and a light blocking area BA between the first and second pixel areas PA1 and PA2. The first pixel area PA1 and the second pixel area PA2 of FIG. 11 may correspond to the first pixel area PA1 and the second pixel area PA2 of FIG. 3.

A first color filter layer 130a, and a first color conversion layer 160 are arranged in the first pixel area PA1, a second color filter layer 130b, and a second color conversion layer 170 are arranged in the second pixel area PA2, and a light blocking layer 120 and a partition wall 150 are arranged in the light blocking area BA. A filling layer 500 may be on the first and second color conversion layers 160 and 170. The filling layer 500 flattens the upper surface thereof and covers the color filter.

As described above, the first color conversion layer 160 includes first quantum dots and converts incident blue light Lib into light Lr of a first color, and the second color conversion layer 170 includes second quantum dots and converts incident blue light Lib into light Lg of a second color. In such an embodiment, as part of the light reflected by the quantum dots is re-reflected through the structure of the light reflection layer 140 and the partition wall 150, light entering the adjacent pixel area may be blocked and light efficiency may be increased through light recycling.

The color filter shown in FIG. 12 is substantially the same as that of FIG. 11, except for a structure of a partition wall 150'. While the partition wall 150 of FIG. 11 is formed to fill the light blocking area BA, the partition wall 150' of FIG. 12 is formed to cover the side surfaces of the first color filter layer 130a and the first color conversion layer 160 and the side surfaces of the second color filter layer 130b and the second color conversion layer 170. Part of the filling layer 500 may fill a space between the partition walls 150'.

The disclosure has been described with reference to the embodiments illustrated in the drawings, but this is only an example, and those of ordinary skill in the art will appreciate that various modifications and other equivalent embodiments are possible therefrom. Therefore, the true technical protection scope of the disclosure should be determined by the technical spirit of the appended claims.

The invention claimed is:

1. A color filter comprising:
   a substrate on which a plurality of pixel areas and a light blocking area surrounding the plurality of pixel areas are defined;
   a light blocking layer on the light blocking area;
   a first color conversion layer on a first pixel area among the plurality of pixel areas, wherein the first color conversion layer converts incident light into light of a first color;
   a first color filter layer between the substrate and the first color conversion layer, wherein the first color filter layer selectively transmits the light of the first color emitted from the first color conversion layer; and
   a light reflection layer between the first color conversion layer and the first color filter layer, wherein the light reflection layer includes a reflective material.

2. The color filter of claim 1, wherein
   the first color filter layer covers an edge of the light blocking layer, and
   the light reflection layer overlaps the light blocking layer.

3. The color filter of claim 1, further comprising:
   a second color conversion layer on a second pixel area apart from the first pixel area by the light blocking area among the plurality of pixel areas, wherein the second color conversion layer converts the incident light into light of a second color; and
   a second color filter layer between the substrate and the second color conversion layer, wherein the second color filter layer selectively transmits the light of the second color emitted from the second color conversion layer.

4. The color filter of claim 3, further comprising:
a partition wall between the first color conversion layer and the second color conversion layer on the light blocking area, wherein the partition wall includes a reflective material.

5. The color filter of claim 3, further comprising:
a transmission layer on a third pixel area apart from the first pixel area and the second pixel area by the light blocking area among the plurality of pixel areas, wherein the transmission layer transmits the incident light; and
a third color filter layer between the substrate and the transmission layer, wherein the third color filter selectively transmits the incident light.

6. The color filter of claim 5, wherein
the incident light is blue light, and
the first color is red or green.

7. The color filter of claim 3, further comprising:
a third color conversion layer on a third pixel area apart from the first pixel area and the second pixel area by the light blocking area among the plurality of pixel areas, wherein the third color conversion layer converts the incident light into light of a third color; and
a third color filter layer between the substrate and the third color conversion layer, to the third color filter layer selectively transmits the light of the third color emitted from the third color conversion layer.

8. The color filter of claim 7, wherein
the incident light is ultraviolet light, and
the first color is red, green, or blue.

9. The color filter of claim 7, wherein the light reflection layer is between the second color conversion layer and the second color filter layer to overlap the light blocking layer.

10. The color filter of claim 1, wherein the first color conversion layer comprises first quantum dots which are excited by the incident light and emit the light of the first color having a wavelength longer than a wavelength of the incident light.

11. The color filter of claim 1, wherein the incident light has a wavelength shorter than a wavelength of the light of the first color.

12. The color filter of claim 1, wherein the light blocking layer includes a light absorbing material including an organic material.

13. The color filter of claim 1, further comprising:
a first partition wall arranged to cover sidewalls of the first color conversion layer and the first color filter layer corresponding to the light blocking area, wherein the first partition wall includes a reflective material.

14. The color filter of claim 13, further comprising:
a second color conversion layer on a second pixel area among the plurality of pixel areas, wherein the second color conversion layer converts the incident light into light of a second color;
a second color filter layer between the substrate and the second color conversion layer, wherein the second color filter layer selectively transmits the light of the second color emitted from the second color conversion layer; and
a second partition wall disposed to cover sidewalls of the second color conversion layer and the second color filter layer corresponding to the light blocking area, wherein the second partition wall includes a reflective material.

15. The color filter of claim 14, further comprising:
a filling layer between the first partition wall and the second partition wall corresponding to the light blocking area.

16. A display device comprising:
a display panel in which a plurality of pixels are arranged, wherein each of the plurality of pixels comprises light-emitting element; and
a color filter which converts a wavelength of light emitted from the light-emitting element of each of the plurality of pixels to implement a color,
wherein the color filter comprises:
a first substrate on which a plurality of pixel areas and a light blocking area surrounding the plurality of pixel areas are defined;
a light blocking layer on the light blocking area;
a first color conversion layer on a first pixel area among the plurality of pixel areas, wherein the first color conversion layer converts incident light into light of a first color;
a first color filter layer between the first substrate and the first color conversion layer, wherein the first color filter layer selectively transmits the light of the first color emitted from the first color conversion layer; and
a light reflection layer between the first color conversion layer and the first color filter layer, wherein the light reflection layer includes a reflective material.

17. The display device of claim 16, wherein the display panel comprises:
a second substrate on which the plurality of pixels are arranged; and
a thin-film encapsulation layer on the second substrate.

18. The display device of claim 17, further comprising:
a filling layer between the thin-film encapsulation layer and the color filter.

19. The display device of claim 16, wherein
the first color filter layer is arranged in the color filter to cover an edge of the light blocking layer, and
the light reflection layer is arranged in the color filter to overlap the light blocking layer.

20. The display device of claim 16, wherein the color filter further comprises:
a second color conversion layer on a second pixel area apart from the first pixel area by the light blocking area among the plurality of pixel areas, wherein the second color conversion layer converts the incident light into light of a second color;
a second color filter layer between the first substrate and the second color conversion layer, wherein the second color filter layer selectively transmits the light of the second color emitted from the second color conversion layer; and
a partition wall between the first color conversion layer and the second color conversion layer on the light blocking area, wherein the partition wall includes a reflective material.

* * * * *